(12) United States Patent
Kang et al.

(10) Patent No.: US 12,426,511 B2
(45) Date of Patent: Sep. 23, 2025

(54) STACK-TYPE PIEZOELECTRIC ELEMENT AND PIEZOELECTRIC ACTUATOR INCLUDING THE SAME

(71) Applicant: KOREA ELECTRONICS TECHNOLOGY INSTITUTE, Seongnam-si (KR)

(72) Inventors: Hyung Won Kang, Seoul (KR); Seung Ho Han, Gwacheon-si (KR); In Tae Seo, Gwangju-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 936 days.

(21) Appl. No.: 17/567,676

(22) Filed: Jan. 3, 2022

(65) Prior Publication Data

US 2022/0216391 A1 Jul. 7, 2022

(30) Foreign Application Priority Data

Jan. 2, 2021 (KR) ........................ 10-2021-0000038

(51) Int. Cl.
*H01L 41/047* (2006.01)
*H10N 30/20* (2023.01)
(Continued)

(52) U.S. Cl.
CPC ........... *H10N 30/871* (2023.02); *H10N 30/20* (2023.02); *H10N 30/50* (2023.02)

(58) Field of Classification Search
CPC ....... H10N 30/871; H10N 30/50; H10N 30/20
See application file for complete search history.

(56) References Cited

U.S. PATENT DOCUMENTS

| | | | | |
|---|---|---|---|---|
| 2011/0057543 | A1* | 3/2011 | Adachi | .............. H10N 30/2023 |
| | | | | 310/323.02 |
| 2013/0341082 | A1* | 12/2013 | Kuroda | .................... H05K 7/00 |
| | | | | 174/527 |

(Continued)

FOREIGN PATENT DOCUMENTS

| | | |
|---|---|---|
| JP | S60-044495 U | 3/1985 |
| KR | 10-0280072 B1 | 2/2001 |

(Continued)

OTHER PUBLICATIONS

Office Action of the corresponding Korean Application No. 10-2021-0000038 dated Jun. 20, 2023.

(Continued)

*Primary Examiner* — Bryan P Gordon
(74) *Attorney, Agent, or Firm* — Knobbe, Martens, Olson & Bear, LLP

(57) ABSTRACT

A stack-type piezoelectric element is implemented with a reduced capacitance value without a reduction in displacement amount. The stack-type piezoelectric element includes a piezoelectric layer formed of a piezoelectric material, and electrode layers formed in and on the piezoelectric layer and including at least one internal electrode layer formed inside the piezoelectric layer. Each of the at least one internal electrode layer includes a plurality of split electrodes that are separated and arranged in a longitudinal direction. A piezoelectric actuator including the stack-type piezoelectric element is also provided.

6 Claims, 3 Drawing Sheets

(51) Int. Cl.
*H10N 30/50* (2023.01)
*H10N 30/87* (2023.01)

(56) References Cited

U.S. PATENT DOCUMENTS

| | | | |
|---|---|---|---|
| 2016/0050498 A1* | 2/2016 | Ogata | H04R 17/10 |
| | | | 381/190 |
| 2016/0233024 A1* | 8/2016 | Kim | H01G 4/30 |
| 2019/0296215 A1* | 9/2019 | Kobayashi | H10N 30/05 |

FOREIGN PATENT DOCUMENTS

| | | |
|---|---|---|
| KR | 10-2014-0079438 A | 6/2014 |
| KR | 10-2017-0054569 A | 5/2017 |
| KR | 10-2122891 B1 | 6/2020 |

OTHER PUBLICATIONS

Notice of Allowance in Korean Patent Application No. 10-2021-0000038 issued on Dec. 20, 2023.

\* cited by examiner

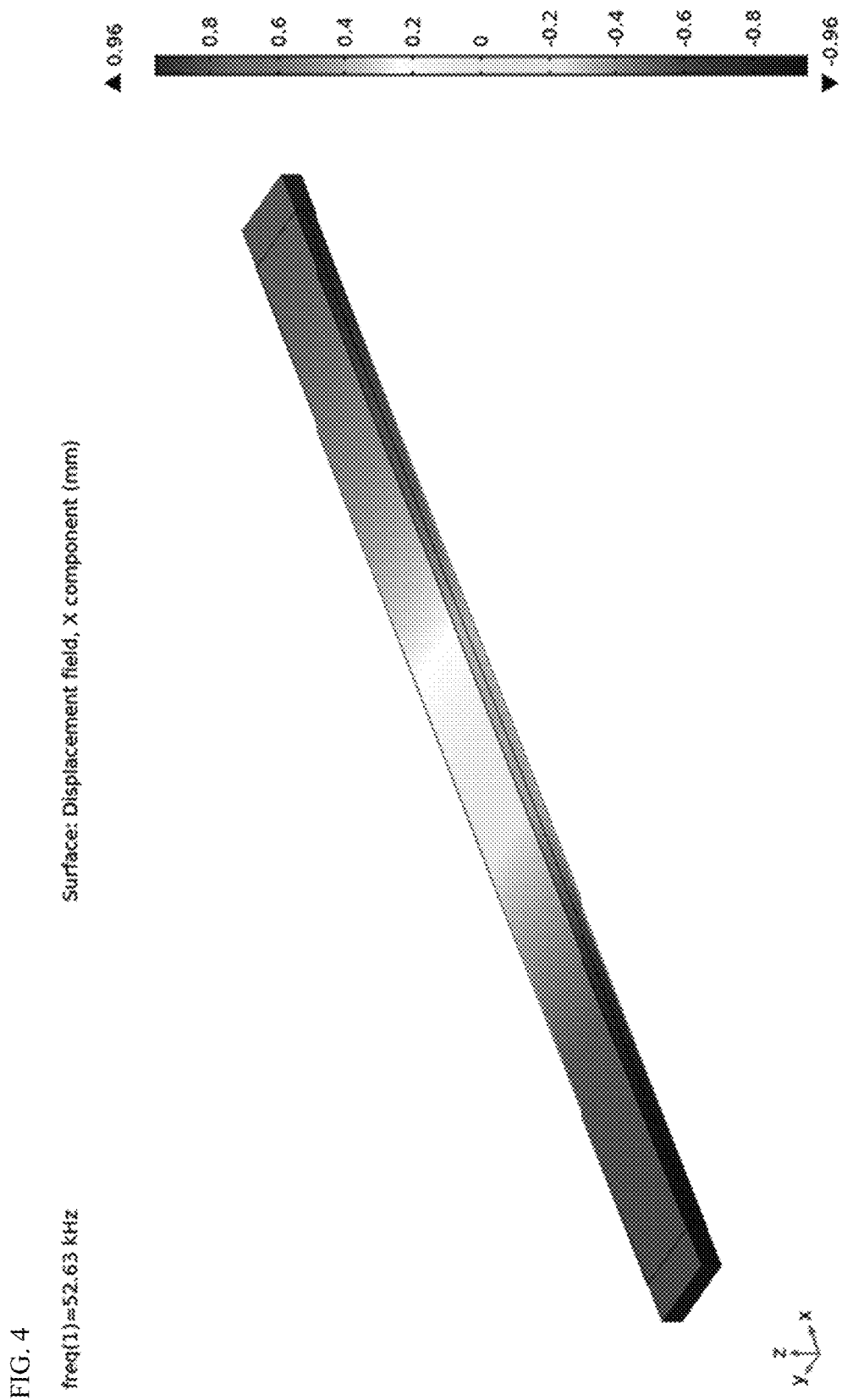

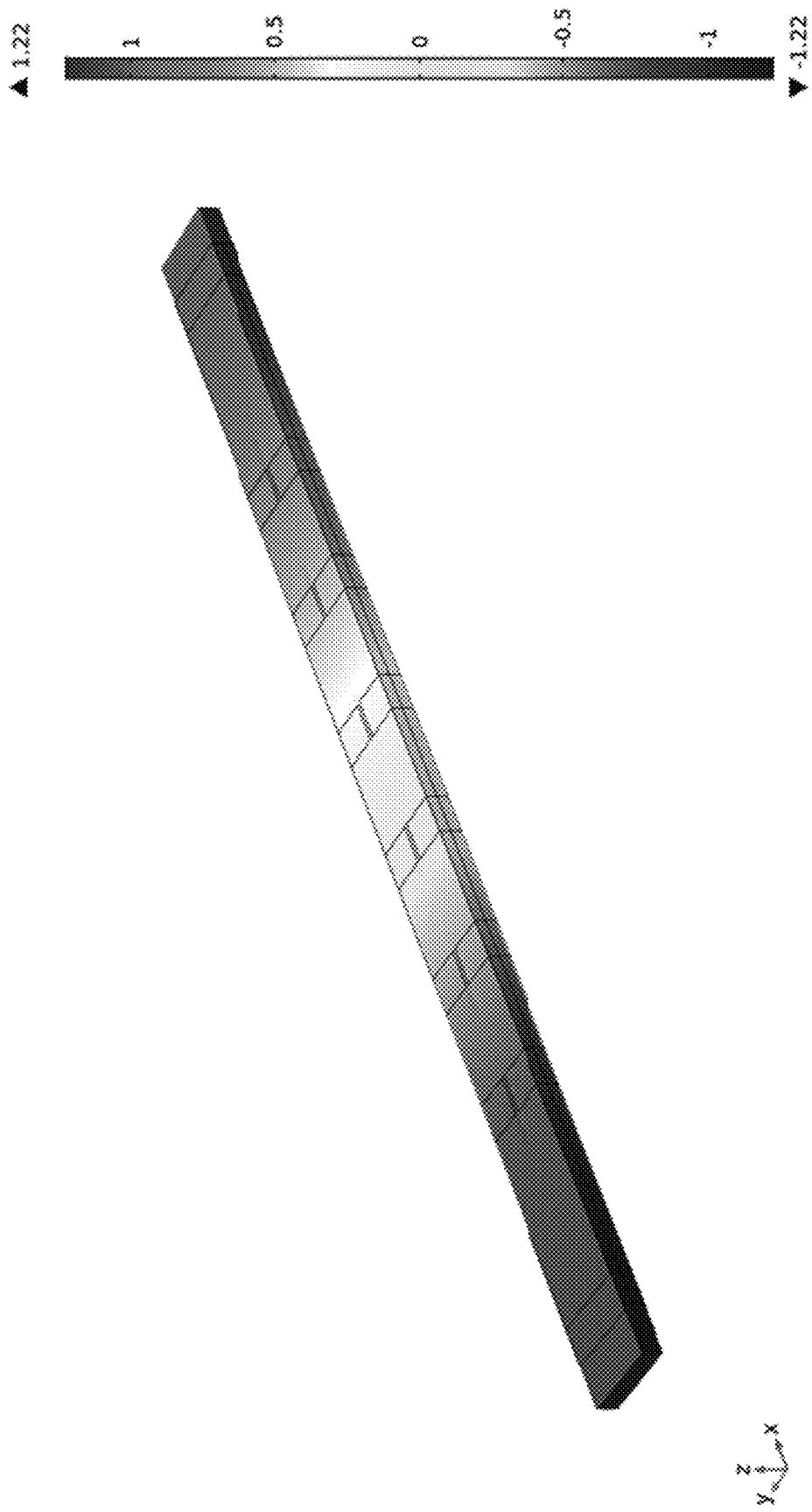

STACK-TYPE PIEZOELECTRIC ELEMENT AND PIEZOELECTRIC ACTUATOR INCLUDING THE SAME

CROSS-REFERENCE TO RELATED APPLICATION

The present application claims priority to Korean Patent Application No. 10-2021-0000038 filed on Jan. 2, 2021 in the Korean Intellectual Property Office, which is incorporated herein in its entirety by reference.

BACKGROUND

Technical Field

The present disclosure relates to a piezoelectric actuator. Particularly, the present disclosure relates to a stack-type piezoelectric element with a reduced capacitance value without a reduction in displacement amount, and to a piezoelectric actuator including the same.

Description of Related Technology

Piezoelectric actuators are being actively studied as replacement components for electromagnetic actuators. The piezoelectric actuator refers to a component that operates by a phenomenon that contraction and expansion displacement occurs when an electrical signal is applied to a piezoelectric element.

SUMMARY

One aspect of the present disclosure is a stack-type piezoelectric element with a reduced capacitance value without a reduction in displacement amount.

Embodiments of the present disclosure provide a stack-type piezoelectric element that includes a piezoelectric layer formed of a piezoelectric material, and electrode layers formed in and on the piezoelectric layer and including at least one internal electrode layer formed inside the piezoelectric layer. Each of the at least one the internal electrode layer may include a plurality of split electrodes that are separated and arranged in a longitudinal direction.

Each of the at least one the internal electrode layer may further include a connection pattern connecting adjacent split electrodes of the plurality of split electrodes.

The plurality of split electrodes may include a pair of outer split electrodes positioned near both ends, and a plurality of inner split electrodes arranged in a line between the pair of outer split electrodes and smaller in size than the outer split electrodes.

The outer split electrode may have a rectangular shape, and the inner split electrode may have a square shape.

The electrode layers may include a first surface electrode layer formed on a lower surface of the piezoelectric layer, a second surface electrode layer formed on an upper surface of the piezoelectric layer, a plurality of internal electrode layers formed as multiple layers inside the piezoelectric layer, a first external electrode layer formed on one lateral surface of the piezoelectric layer and electrically connected to the first surface electrode layer and some of the plurality of internal electrode layers, and a second external electrode layer formed on other lateral surface of the piezoelectric layer and electrically connected to the second surface electrode layer and others of the plurality of internal electrode layers.

In addition, embodiments of the present disclosure provide a piezoelectric actuator that includes the above-mentioned stack-type piezoelectric element.

According to embodiments of the disclosure, the internal electrode layer is divided into the plurality of split electrodes and thus has a reduced area. This allows the stack-type piezoelectric element to have a reduced capacitance value relying on the area of the internal electrode layer.

In addition, among the plurality of split electrodes arranged to constitute the internal electrode layer, inner split electrodes are formed to be smaller in size than outer split electrodes. This allows a displacement value to be maintained to correspond to a conventional internal electrode layer formed in a full-surface electrode structure.

BRIEF DESCRIPTION OF THE DRAWINGS

FIG. 4 is a view showing a simulation result of the displacement amount of an internal electrode layer according to a comparative example.

FIG. 5 is a view showing a simulation result of the displacement amount of an internal electrode layer according to an embodiment of the disclosure.

DETAILED DESCRIPTION

A piezoelectric element may be manufactured in a single plate-type structure or a stack-type structure. The stack-type structure has an advantage that the actuator can operate with a lower voltage compared to the single plate-type structure. The stack-type structure has a disadvantage in that an overcurrent is generated during operation because of an increase in current caused by an increase in a capacitance value. That is, a conventional stack-type piezoelectric element has a full-surface electrode structure that an internal electrode layer is formed on the entire surface of a piezoelectric layer. This internal electrode layer increases a capacitance value, thus causing an overcurrent when the stack-type piezoelectric element is operating.

Hereinafter, an embodiment of the present disclosure will be described in detail with reference to the accompanying drawings. The present disclosure may, however, be embodied in many different forms and should not be construed as being limited to the embodiment set forth herein. Rather, this embodiment is provided so that the disclosure will be thorough and complete and will fully convey the scope of the disclosure to those skilled in the art. Accordingly, an embodiment described herein should be understood to include various modifications, equivalents, and/or alternatives.

In addition, techniques that are well known in the art and not directly related to the present disclosure are not described herein. This is to clearly convey the subject matter of the present disclosure by omitting an unnecessary explanation. Also, the terms are merely used for describing a particular embodiment but do not limit the embodiment. Singular forms are intended to include plural forms unless the context clearly indicates otherwise.

Figure 1:
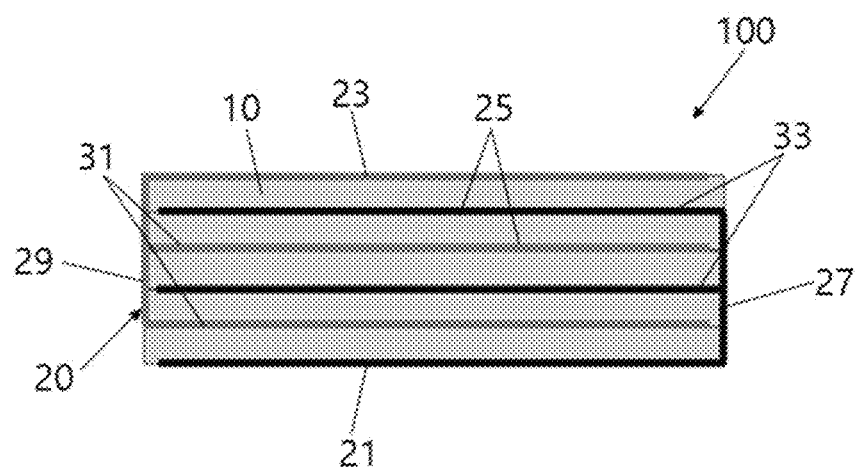
FIG. 1 is a cross-sectional view showing a stack-type piezoelectric element according to the present disclosure.
Figure 2:
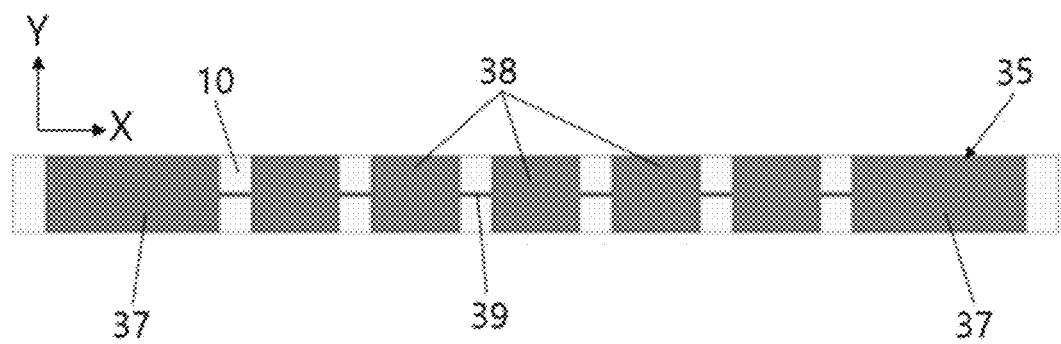
FIG. 2 is a plan view showing an internal electrode layer of the stack-type piezoelectric element shown in FIG. 1.
Figure 3:
FIG. 3 is a plan view showing a conventional internal electrode layer.

FIG. 1 is a cross-sectional view showing a stack-type piezoelectric element according to the present disclosure. FIG. 2 is a plan view showing an internal electrode layer of the stack-type piezoelectric element shown in FIG. 1. FIG. 3 is a plan view showing a conventional internal electrode layer.

Referring to FIGS. 1 and 2, the stack-type piezoelectric element 100 according to the present disclosure includes a piezoelectric layer 10 formed of a piezoelectric material, and electrode layers 20 formed in and on the piezoelectric layer 10. The electrode layers 20 include at least one internal electrode layer 25 formed inside the piezoelectric layer 10. In addition, the internal electrode layer 25 includes a plurality of split electrodes 35 that are separated and arranged in a longitudinal direction, that is, in the X-axis direction.

As such, the internal electrode layer 25 is divided into the plurality of split electrodes 35, thus having a reduced area. Therefore, the stack-type piezoelectric element 100 according to the present disclosure can have a reduced capacitance value relying on the area of the internal electrode layer 25.

Now, the stack-type piezoelectric element 100 according to the present disclosure will be described in detail.

The stack-type piezoelectric element 100 according to the present disclosure includes the electrode layers 20 having a long length in the X-axis direction, having a short length in the Y-axis direction, and stacked in the Z-axis direction. That is, the stack-type piezoelectric element 100 may have a rectangular parallelepiped shape with a thin thickness in the Z-axis direction.

The stack-type piezoelectric element 100 according to the present disclosure may be used as a piezoelectric actuator that operates in the X-axis direction by the piezoelectric lateral effect.

The piezoelectric layer 10 is formed of a piezoelectric material. For example, the piezoelectric material may include, but is not limited to, $BaTiO_3$, $BiTiO_3$, $PbTiO_3$, $Pb[Zr_xTi_{1-x}]O_3$, $KNbO_3$, $LiNbO_3$, $LiTaO_3$, $Na_2WO_3$, $NaNbO_3$, $NaTiO_3$, $ZnO$, $BaNaNb_5O_5$, $Pb_2kNb_5O_{15}$, and the like.

The electrode layers 20 receives a driving voltage necessary for driving the stack-type piezoelectric element 100. The electrode layers 20 may be formed on upper and lower surfaces and both lateral surfaces of the piezoelectric layer 10 and inside the piezoelectric layer 10. As the material of the electrode layers 20, a material having low reactivity with the piezoelectric element and good electrical conductivity may be used. For example, the material of the electrode layers 20 may include, but is not limited to, copper, silver, aluminum, platinum, or any alloy thereof.

The electrode layers 20 include first and second surface electrode layers 21 and 23, a plurality of internal electrode layers 25, and first and second external electrode layers 27 and 29.

The first surface electrode layer 21 is formed on the lower surface of the piezoelectric layer 10.

The second surface electrode layer 23 is formed on the upper surface of the piezoelectric layer 10.

The plurality of internal electrode layers 25 are formed as multiple layers inside the piezoelectric layer 10.

The first external electrode layer 27 is formed on one lateral surface of the piezoelectric layer 10 and electrically connected to the first surface electrode layer 21 and some of the plurality of internal electrode layers 25.

The second external electrode layer 29 is formed on the other lateral surface of the piezoelectric layer 10 and electrically connected to the second surface electrode layer 23 and the others of the plurality of internal electrode layers 25.

The first and second surface electrode layers 21 and 23 may be entirely formed on the upper and lower surfaces of the piezoelectric layer 10, respectively. Alternatively, as will be described later, the first and second surface electrode layers 21 and 23 may be formed of a plurality of split electrodes 35 in the same manner as the internal electrode layer 25.

The plurality of internal electrode layers 25 include a first internal electrode layer 31 connected to the first external electrode layer 27, and a second internal electrode layer 33 connected to the second external electrode layer 29. When the first and second internal electrode layers 31 and 33 are formed in plurality, they may be alternately stacked.

Each internal electrode layer 25 includes a plurality of split electrodes 35 and a connection pattern 39 connecting adjacent split electrodes 35.

The plurality of split electrodes 35 include a pair of outer split electrodes 37 positioned near both ends, and a plurality of inner split electrodes 38 positioned between the pair of outer split electrodes 37. The plurality of inner split electrodes 38 are arranged in a line between the pair of outer split electrodes 37, and are smaller in size than the outer split electrodes 37. For example, the outer split electrode 37 may have a rectangular shape, and the inner split electrode 38 may have a square shape. In this case, the outer split electrode 37 may have a long side in the X-axis direction which is a longitudinal direction of the stack-type piezoelectric element 100, and a short side in the Y-axis direction.

The size of the split electrode 35 may be appropriately selected in consideration of the length of the stack-type piezoelectric element 100.

Even if the internal electrode layer 25 is formed to have an area of 70% or more compared to the area of the conventional internal electrode layer 125 formed on the entire surface as shown in FIG. 3, it may have a displacement value corresponding to that of the conventional internal electrode layer 125. However, in case of an area smaller than 70%, the displacement value may be lowered.

As described above, the internal electrode layer 25 is divided into the plurality of split electrodes 35 and thus has a reduced area. This allows the stack-type piezoelectric element 100 according to the present disclosure to have a reduced capacitance value relying on the area of the internal electrode layer 25.

Meanwhile, the stack-type piezoelectric element 100 according to the present disclosure may be manufactured by laminating unit piezoelectric layers constituting the piezoelectric layer 10 between the electrode layers 20 and then compressing the laminated layers.

Embodiment and Comparative Example

In order to confirm the displacement value of the stack-type piezoelectric element including the divided internal electrode layer according to the present disclosure, simulations were performed for stack-type piezoelectric elements according to an embodiment and a comparative example. The results are shown in FIGS. 4 and 5.

FIG. 4 is a view showing a simulation result of the displacement amount of an internal electrode layer according to a comparative example. FIG. 5 is a view showing a simulation result of the displacement amount of an internal electrode layer according to an embodiment of the disclosure. The internal electrode layer according to the comparative example is formed on the entire surface of the piezoelectric layer as shown in FIG. 3. The internal electrode layer according to the embodiment is formed of a plurality of split electrodes on the piezoelectric layer as shown in FIG. 2. When the area of the internal electrode layer according to the comparative example is 100%, the area of the internal electrode layer according to the embodiment is 75%. As shown in FIG. 2, the internal electrode layer according to the embodiment includes five inner split electrodes 38 between a pair of outer split electrodes 37.

From FIGS. 4 and 5, it can be seen that the internal electrode layer according to the embodiment has displacement values corresponding to those of the internal electrode layer according to the comparative example.

In addition, the internal electrode layer may vary according to the length of the stack-type piezoelectric element. Moreover, through simulation of a plurality of split electrodes constituting the internal electrode layer, it is possible to implement the internal electrode layer according to the embodiment so as to have improved displacement values than those of the internal electrode layer according to the comparative example.

While the present disclosure has been particularly shown and described with reference to an exemplary embodiment thereof, it will be understood by those skilled in the art that various changes in form and details may be made therein without departing from the scope of the present disclosure as defined by the appended claims.

What is claimed is:

1. A stack-type piezoelectric element comprising:
   a piezoelectric layer comprising a piezoelectric material; and
   a plurality of electrode layers that comprise an internal electrode layer formed inside the piezoelectric layer,
   wherein the internal electrode layer has a length and comprises a plurality of split electrodes that are arranged in a direction of the length, and
   wherein the internal electrode layer comprises a connection pattern connecting two adjacent split electrodes among the plurality of split electrodes.

2. The stack-type piezoelectric element of claim 1, wherein the plurality of split electrodes comprise:
   a pair of outer split electrodes positioned near both ends of the internal electrode layer; and
   a plurality of inner split electrodes arranged in a line between the pair of outer split electrodes and smaller in size than the pair of outer split electrodes.

3. The stack-type piezoelectric element of claim 2, wherein each of the outer split electrodes has a rectangular shape, and wherein each of the plurality of inner split electrodes has a square shape.

4. The stack-type piezoelectric element of claim 1, wherein the plurality of electrode layers further comprise:
   a first surface electrode layer formed on a lower surface of the piezoelectric layer;
   a second surface electrode layer formed on an upper surface of the piezoelectric layer;
   a plurality of additional internal electrode layers, the internal electrode layer and the plurality of additional internal electrode layers being formed as multiple layers inside the piezoelectric layer;
   a first external electrode layer formed on one lateral surface of the piezoelectric layer and electrically connected to the first surface electrode layer and the internal electrode layer; and
   a second external electrode layer formed on other lateral surface of the piezoelectric layer and electrically connected to the second surface electrode layer and at least one of the plurality of additional internal electrode layers.

5. A piezoelectric actuator comprising:
   the stack-type piezoelectric element of claim 1.

6. The stack-type piezoelectric element of claim 1, further comprising an external electrode layer formed outside the piezoelectric layer,
   wherein the two adjacent split electrodes comprise a first split electrode contacting the external electrode layer and a second split electrode that does not contact the external electrode layer.

* * * * *